United States Patent [19]

Kaufmann et al.

[11] Patent Number: 5,250,779
[45] Date of Patent: Oct. 5, 1993

[54] METHOD AND APPARATUS FOR HEATING-UP A SUBSTRATE BY MEANS OF A LOW VOLTAGE ARC DISCHARGE AND VARIABLE MAGNETIC FIELD

[75] Inventors: Helmut Kaufmann, Triesen, Liechtenstein; Roland Schmid, Göfis, Austria

[73] Assignee: Balzers Aktiengesellschaft, Liechtenstein

[21] Appl. No.: 995,947

[22] Filed: Dec. 18, 1992

Related U.S. Application Data

[63] Continuation of Ser. No. 784,703, Oct. 30, 1991, abandoned.

[30] Foreign Application Priority Data

Nov. 5, 1990 [DE] Fed. Rep. of Germany ....... 4035131

[51] Int. Cl.$^5$ ............................................. B23K 9/00
[52] U.S. Cl. ..................... 219/121.12; 204/192.38; 204/298.41; 219/121.36; 219/121.58; 219/121.59
[58] Field of Search ............... 204/192.38, 298.41; 219/121.11, 121.12, 121.36, 121.25, 121.35, 121.59, 121.58

[56] References Cited

U.S. PATENT DOCUMENTS

| | | | |
|---|---|---|---|
| 3,839,182 | 10/1974 | Sager | 204/298.41 |
| 4,197,175 | 4/1980 | Moll et al. | 204/298.41 X |
| 4,254,159 | 3/1981 | Fulker et al. | 204/298.41 X |
| 4,448,802 | 5/1984 | Buhl et al. | 204/298.41 X |
| 4,555,611 | 11/1985 | Moll | 219/121.11 |
| 4,877,505 | 10/1989 | Bergmann | 204/298.41 X |
| 4,919,968 | 4/1990 | Buhl et al. | 204/298.41 X |

FOREIGN PATENT DOCUMENTS 658545 11/1986 Switzerland .

*Primary Examiner*—Nam Nguyen
*Attorney, Agent, or Firm*—Notaro & Michalos

[57] ABSTRACT

In order to heat-up a commodity to be heated or a substrate to be coated, uniformly in a vacuum chamber or in a recipient, by means of a gas discharge or low voltage arc discharge, at least one locally variable and/or displaceable magnetic field is maintained in the vacuum chamber or in the recipient at least during the heating up step. Preferably, at least two magnet fields are maintained which partially overlap and which alternatingly are operated stronger or weaker, to therewith locally influence the current density in the vacuum chamber or recipient, in order to produce along the substrate or the commodity to be heated, alternatingly a stronger or less strong heating.

9 Claims, 3 Drawing Sheets

METHOD AND APPARATUS FOR HEATING-UP A SUBSTRATE BY MEANS OF A LOW VOLTAGE ARC DISCHARGE AND VARIABLE MAGNETIC FIELD

This application is a continuation of application Ser. No. 07/784,703, filed Oct. 30, 1991, abandoned.

BACKGROUND OF THE INVENTION

1. Field of the Invention

The present invention relates generally to a method of and apparatus for heating a commodity to be heated in a vacuum chamber. Such methods are used e.g. for a degassing, soldering, sintering, hardening and in connection with coating or ion treatment methods. Thereby, an as uniform as possible heating of the commodity to be heated must be obtained.

2. Description of the Prior Art

In generally known vacuum heating furnaces the commodity to be heated is surrounded by heating surfaces from which the heat is transmitted onto the commodity to be heated by convection or heat conduction. Electrically conducting commodities to be heated can also be heated by induced current flows, and, furthermore, the use of a glow-discharge as the heat source, is known which in case of the so-called anomal discharge covers the entire cathode surface uniformly such that the commodity to be heated, which is connected as cathode, can be heated uniformly.

It is known further to heat metals to be melted in a vacuum by means of an electron bombardment. It must thereby be assured, however, that by means of a specific geometric arrangement of the source of electrons that the desired distribution of temperature on the commodity to be heated is arrived at. Until now, it was possible to reach a uniform heating only with a correspondingly high expenditure. Usually, however, the electron bombardment is applied precisely in the opposite sense, namely to produce a locally confined hot spot with high temperature differences relative to the surroundings, for which task electron beams are specifically suitable, due to the fact that they can be focussed quite easily.

A specific form of heating using electron bombardment involves a low voltage arc; in the context of this description a low voltage arc is to be understood as a gas discharge which burns between a hot cathode which emits electrons by a glow emission, and an anode (in this context it is unimportent if the cathode is maintained at the emission temperature solely by the gas discharge or if it is heated additionally). In most cases a noble gas is fed close to the cathode, e.g. into the hollow space of a hollow cathode or into a specific glowing cathode chamber which communicates with the vacuum chamber via an opening. It is a general procedure to focus the plasma entering the chamber from the hollow cathode or from the glowing cathode chamber via the opening by means of a magnetic field. The electrons travel thereby along tight or confined helical paths, of which the center lines correspond to a large extent to the lines of flux of the magnetic field. Arrangements of this kind are disclosed e.g. in the U.S. Pat. Nos. 3,210,454 and 4,197,175. Both describe the heating of a melting charge which is connected as anode by means of a magnetically focussed low voltage arc which is aimed at the melting charge. The magnetic lines of flux—and accordingly the helix-shaped paths of the electrons—extend through the mentioned opening and through the melting charge. Accordingly, the low voltage arc is here used for the production of locally limited hot spots with high temperature differences relative to the surroundings. To use electron beam furnaces or light arc furnaces for the heat treatment of commodities where the surface is to be heated uniformly, is difficult, because it was hardly possible to achieve a sufficiently uniform distribution of the density of the current on the commodity to be heated.

In accordance with the Swiss Specification CH-PS 658 545 there is, furthermore, proposed a method of a uniform heating of a commodity to be heated in a vacuum chamber by maintaining a magnetically focussed low voltage arc discharge. The magnetic field is thereby maintained in such a manner that the magnetic lines of flux extend substantially parallel to the surfaces of the commodities to be heated. This method has, however, not proven itself as satisfactory specifically for substrates or substrate recipients of rather large length, because the substrate is heated at the so-called center of the bulge or special variation of the magnetic field, more strongly than at the edge areas of the magnetic field, which leads to a loss of hardness of the base material.

The German Specification DE-OS 38 29 260 suggests, finally, to arrange during the heating-up phase a screen between the cathode and the object to be coated which is removed after reaching the process temperature. However, this procedure again does not solve the problem of uniform heating.

SUMMARY OF THE INVENTION

It is, therefore, a general object of the invention to provide a method of and apparatus for an uniform heating of a commodity or substrate to be heated, by means of which it is possible to uniformly heat, for instance even very elongated substrates or elongated supports for a plurality of substrates.

A further object is to provide a method in which at least during the heating phase, at least one locally variable and/or displaceable magnetic field is maintained in order to influence the distribution of the current density or electron density of the electron stream. This is a temporal varying of the magnetic field with time.

Still a further object is to provide an apparatus comprising at least one device adapted to generate a magnetic field in a coating or heating, chamber and to be operated in such a manner that locally a variable magnetic field is generatable.

Yet a further object is to provide a method according to which in the heating chamber in which the commodity to be heated or the substrate to be coated is heated by means of a gas discharge or a low voltage arc discharge, whereby the low voltage arc discharge is focussed magnetically and whereby at least during the heating at least one locally variable and/or displaceable magnetic field is maintained.

Another object is to provide a method and apparatus by means of which it is possible to either hold the magnetic field stationary and to vary the field by means of the current intensity in the magnet coil, or then to locally displace the magnet coil so that also the magnetic field associated therewith is displaced locally. It is critical that the distribution of the current density in the vacuum chamber is influenced in order to displace the electrons in the gas discharge into various areas of the vacuum chamber in order to therewith produce a uniform heating of the surface of the substrate or the surface of the commodity. A higher electron density leads locally to a stronger heating of the respective area of the substrate. By urging the electrons back and forth by varying the magnetic field it is thus possible to achieve a uniform heating of the substrate.

A further object is to provide a method and apparatus in which at least two magnetic fields are maintained which partially overlap and which alternatingly are operated to get stronger and weaker. By means of such procedure it is possible to produce along the surface of the substrate alternatingly a stronger and a weaker heating. The electrons are thereby always urged into that area where the magnetic field is weaker. Correspondingly, the heating of the substrate is higher in such areas where the magnetic field is weaker.

Yet a further object is to provide a method in which at least one or both of the mentioned magnetic fields are maintained locally varied and/or displaceable parallel along the surface of the commodity to be heated or the substrate.

Obviously it is also possible to simultaneously displace the commodity to be heated or the substrate to be coated locally in the magnetic field.

A further object is to provide a method wherein the gas discharge or low voltage arc discharge, proceeds between a hot cathode located in a cathode chamber and an anode.

Yet a further object is to provide a method wherein such a magnetic field is maintained during the heating that those lines of flux of the magnetic field which pass through the opening between the cathode chamber and the recipient for the commodity to be heated or substrate, do not penetrate the commodity to be heated or the substrate.

Another object is to provide a method wherein the commodity to be heated or the substrate is itself switched as anode of the low voltage arc discharge.

Still a further object is to provide a method wherein a magnetic field is maintained at the area of the surfaces of the commodity to be heated or the substrate, which extends substantially parallel to same.

A further object is to provide an apparatus for practicing the inventive method and for the uniform heating of commodities to be heated or of a substrate to be coated, which apparatus includes a vacuum chamber for the receipt of the commodity to be heated or the substrate, a cathode chamber having a hot cathode arranged therein and communicating with the vacuum chamber, and at least one magnet coil located in the area of the vacuum chamber which is adapted to be operated in such a manner that at least during the heating phase, a locally variable and/or displaceable magnetic field can be maintained in the vacuum chamber.

Still a further object is to provide an apparatus in which at least two magnet coils are arranged in the vacuum chamber and which are located at such a distance from each other that two magnetic fields are generated in the vacuum chamber which extend substantially coaxial to the commodity to be heated or substrates.

BRIEF DESCRIPTION OF THE DRAWINGS

The invention will be better understood and objects other than those set forth above will become apparent when consideration is given to the following detailed description. Such description makes reference to the annexed drawings wherein.

DESCRIPTION OF THE PREFERRED EMBODIMENTS

Figure 1:
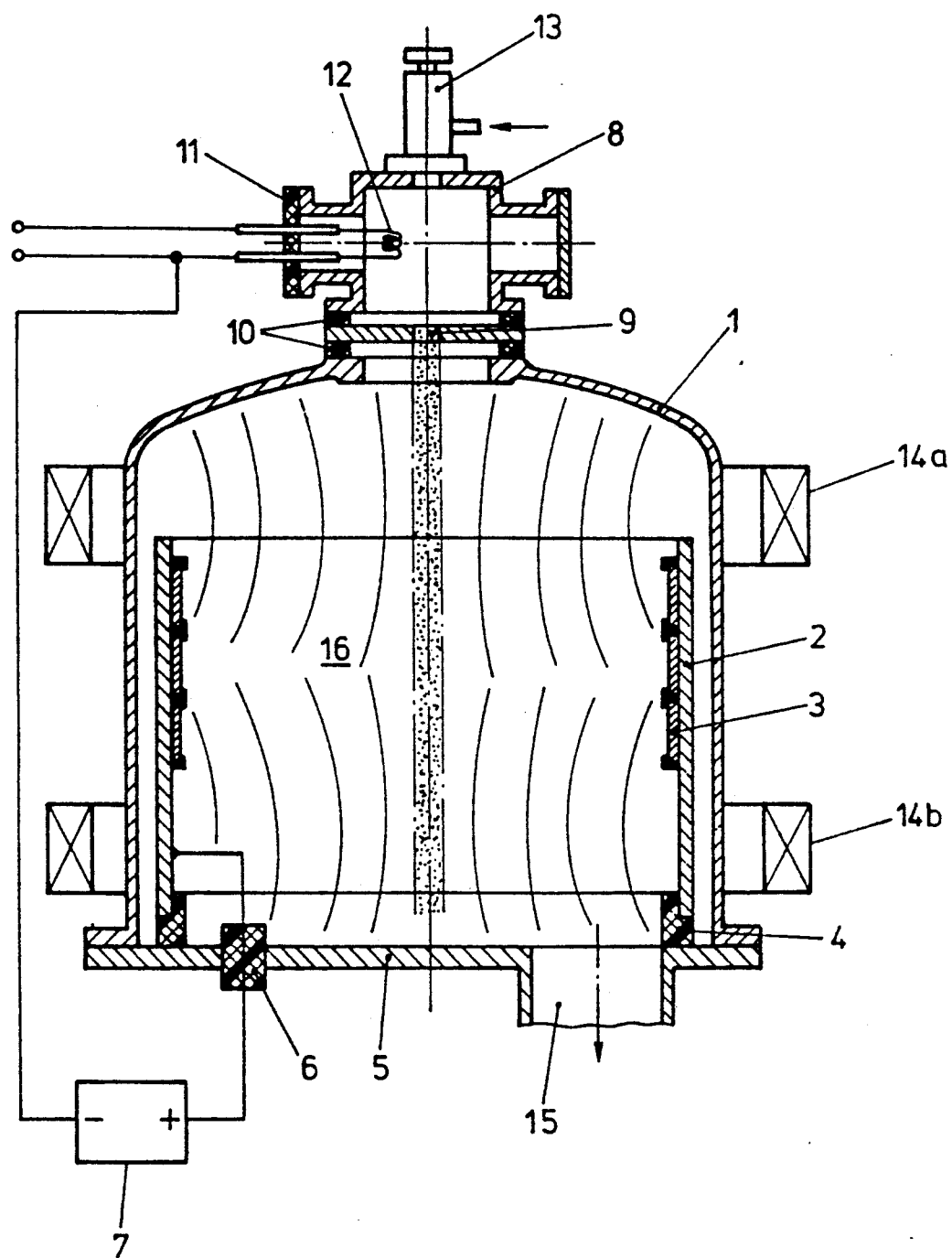
FIG. 1 illustrates a heating or coating chamber having two magnet coils and structured in accordance with the invention.

In FIG. 1 the reference numeral 1 denotes a bell-shaped vacuum chamber in which the commodity 3 to be heated is carried on a support 2. The support is mounted by means of an electrical insulation 4 at the bottom plate 5 of the chamber and is electrically connected by a vacuum tight current lead-in 6 to the positive pole of a supply apparatus 7. A glowing cathode chamber 8 is mounted at the upper part of the recipient and communicates via an opening 9 with the inner space of the recipient 1. The glowing cathode 12 which is carried by an insulated plate 11 is located in this glowing cathode chamber, which glowing cathode 12 can be a wire heated by a current such as indicated in the drawing; it can, however, also be structured in the form of a heated or self heating hollow cathode. A control valve 13 is provided for the infeed of gases into the glowing cathode chamber.

Two magnet coils 14a and 14b generate magnetic fields 16 which extend coaxially to the chamber. If, proceeding from the opening 9, the central line of flux is followed, the magnetic field 16 is initially stronger and reaches a maximal intensity at the center plane of the magnet coil 14a. Proceeding further from the opening 9 the magnetic field loses intensity, grows thereafter stronger and reaches a second maximum of intensity at the center plane of the magnet coil 14b. The intensity or strength of the magnetic fields depend on the current density by means of which the two magnet coils 14a, 14b are operated. In the apparatus illustrated in FIG. 1 it is foreseen to operate the two magnet coils 14a and 14b at different current densities.

In order to run the heating process the air is pumped out of the chamber 1 and the glowing cathode chamber 8 by means of a high vacuum pump at the connecting piece 15 of the chamber, until a pressure of less than about 0.01 p is reached. The pump is kept running and an amount of gas, e.g. the noble gas argon, is fed in through the valve 13 to lead to an argon pressure in the chamber in the range between 0.1 and 1 p. Thereafter, the glowing cathode 12 is heated and the supply apparatus is switched on. This generates an electrical voltage of e.g. 100 V. The electrons which enter the chamber 1 through the opening 9 follow, in case of sufficient field intensities (e.g. 0.01 T) the lines of flux of the magnetic fields. The magnetic fields cause an easier travelling of the electrons parallel to the axis than perpendicular thereto. By means of this the flow of electrons is distributed on the entire support 2 connected as anode.

In contrast to the corresponding apparatus according to the Swiss Specification CH-OS 652 545 where only one coil is present, an arrangement of two coils leads already to a substantial improvement relative to a more uniform heating along the commodity to be heated. In spite of this, certain temperature maxima prevail at the commodity to be heated at the center planes through the magnet coil 14a and 14b, when the magnetic field intensity at the two magnet coils 14a and 14b are the same at the center planes thereof. For this reason it is advantageous to operate the two magnet coils 14a and 14b at differing coil currents, such that differing magnetic fields are produced. By the varying of the magnetic fields the distribution of the current density in the vertical direction relative to the illustration of FIG. 1 can be influenced. A stronger magnetic field in the upper coil urges the electrons in the gas discharge to the lower area of the substrate and causes here a stronger heating. If the lower magnetic field is increased the upper area of the substrate is heated more strongly.

Figure 2:
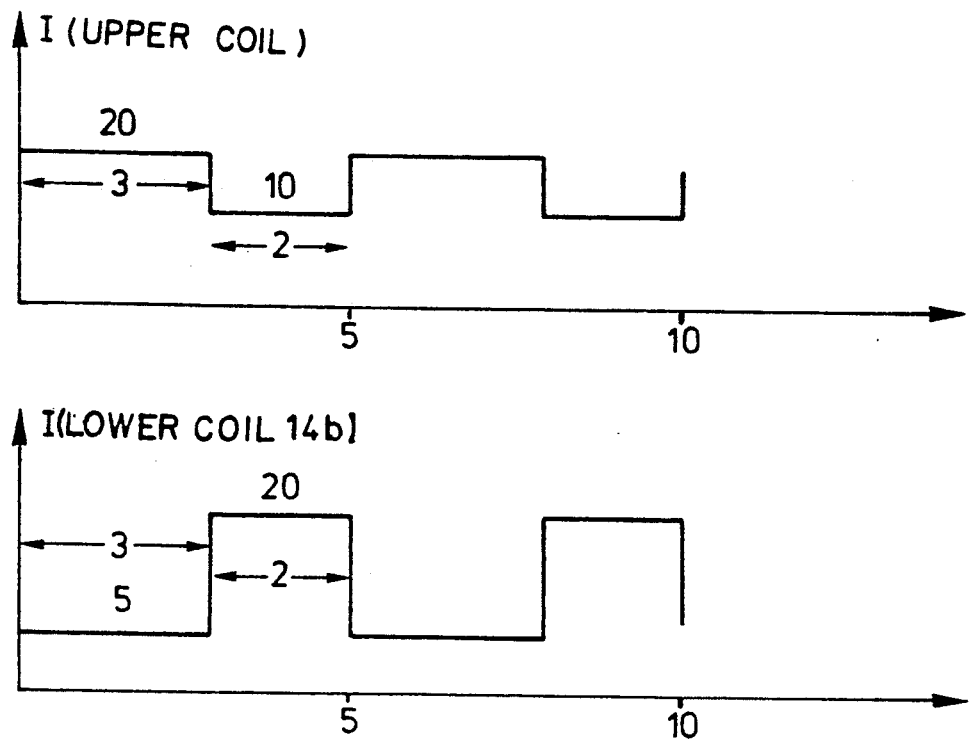
FIG. 2 illustrates, in the form of a diagram, the operation of the two magnet coils.

FIG. 2 illustrates how the two magnet coils 14a and 14b are for instance to be operated. The upper diagram in FIG. 2 relates to the current intensity in the upper coil, whereas the lower diagram relates to the current intensity in the lower coil 14b.

According to FIG. 2 a higher current density I flows at the beginning of the heating-up phase during the first 3 minutes through the upper magnet coil than through the lower coil. During the subsequent 2 further minutes the current density is inverse, i.e. the lower magnet field is stronger than the upper magnet field. Such as mentioned above the electrons in the gas discharge are urged back and forth by the differing magnetic fields such that in this manner the substrate or commodity 3 to be heated, is uniformly heated over its entire surface.

Figure 3:
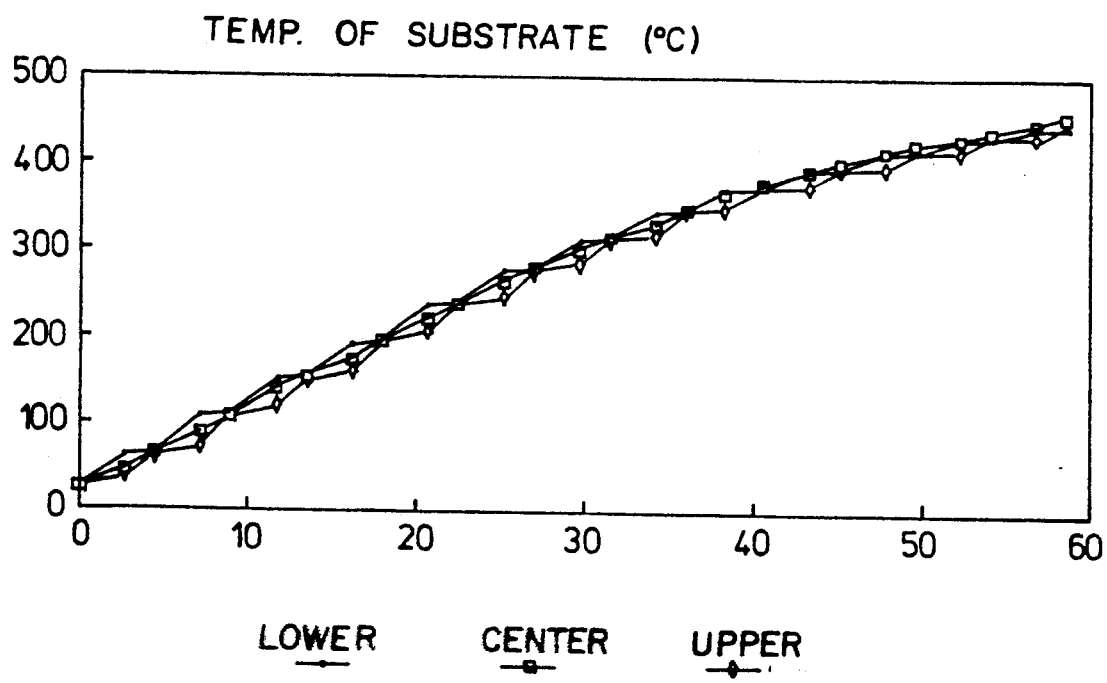
FIGS. 3 and 4 illustrate in form of a diagram the temperature distributions in the vacuum chamber or coating apparatus, with differing magnetic fields and with a uniform magnetic field.
Figure 4:
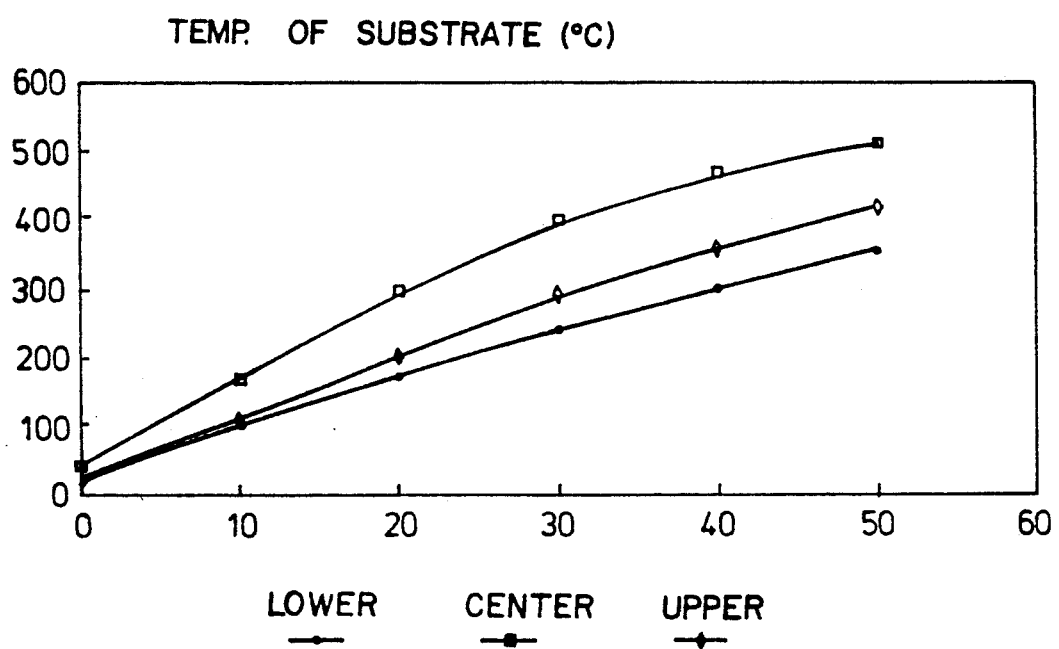

FIGS. 3 and 4 illustrate graphically the influence when the magnetic fields are differently operated. It is clearly visible that at a uniform magnetic field according to FIG. 4 the lower and upper area of the coating apparatus or in the chamber is less heated than the center area. In case of differently operated magnetic fields according to FIG. 3 the heating is uniform and corresponds roughly to the mean value of heating when operating the magnetic field without varying. By the diagram in FIG. 4 it becomes clear that not only the presence of two magnetic fields alone is responsible for a uniform heating of the commodity to be heated, but rather also, such as illustrated in FIG. 4 the variation in operating the magnetic fields such as for instance described with reference to FIG. 2.

The apparatus illustrated in FIG. 1 encompasses obviously only one exemplary embodiment and can be modified and varied quite variously. Thus, it is for instance also possible to arrange only one magnet coil which, however, can be displaced locally. It is also possible to arrange a plurality of magnet coils, whereby for instance additionally a magnet coil can be located in the area of the glowing cathode chamber 8. When a magnet coil is arranged in the area of the glowing cathode chamber 8 it is also possible to arrange only one magnet coil 14 along the chamber 1. In turn, it is possible to generate differing magnetic fields in the chamber by means of differing current intensities I in the accordingly arranged magnet coils. Obviously, it is also possible to substitute a spark chamber similar to the one as disclosed in the DE-OS 38 29 260 for the glowing cathode chamber.

Decisive for the invention is in any case only that at least one magnetic field which can be varied is generated in the coating chamber or in the vacuum chamber to vary in this manner locally the current intensity in the chamber during the heating-up process.

While there are shown and described present preferred embodiments of the invention, it is to be distinctly understood that the invention is not limited thereto, but may be otherwise variously embodied and practiced within the scope of the following claims.

What is claimed is:

1. A method for uniformly heating-up a commodity having a surface, comprising:

providing a vacuum chamber containing the commodity with the commodity surface extending in a selected direction, the vacuum chamber having an opening with a line extending through the opening into the vacuum chamber substantially parallel to the selected direction;

generating electrons at a cathode outside the vacuum chamber, the cathode communicating with the opening for supplying the electrons in a stream to the opening and along the line into the vacuum chamber;

providing an anode in the vacuum chamber for attracting the electrons to the surface of the commodity for heating-up the commodity during a heating-up phase of operation;

generating at least two partially overlapping magnetic fields spaced along the line, the at least two magnetic fields having flux extending at least substantially parallel to the line, the flux spacially varying in strength along the line in a direction away from the opening; and locally temporally varying the magnetic field with time along the line for influencing a distribution of the electrons along the surface of the commodity to uniformly distribute the electrons on the surface for uniformly heating-up the surface at least during the heating-up phase, the local temporal varying of the magnetic field comprising operating the two magnetic fields so that during part of the time of the heating-up phase, one of the magnetic fields is stronger and the other of the magnetic fields is weaker, and during another part of the time of the heating-up phase, said one of the magnetic fields is weaker and said other of the magnetic fields is stronger, the two magnetic fields alternating between being stronger and being weaker a plurality of times during the heating-up phase for causing a uniform distribution of electrons along the surface of the commodity, the strength of the two partly overlapping magnetic fields always being different from each other during the heating-up phase.

2. A method according to claim 1, wherein the surface of the commodity extends substantially parallel to the line.

3. A method according to claim 2, wherein the line extends along an axis of the vacuum chamber, the surface of the commodity extending parallel to the line and at a location around the chamber.

4. A method according to claim 3, wherein the commodity comprises the anode.

5. A method according to claim 3, including a magnetic coil extending around the axis of the vacuum chamber for generating the magnetic field.

6. An apparatus for uniformly heating-up a commodity by bombarding a surface of the commodity, comprising:

a vacuum chamber containing the commodity and having an opening therein for receiving a stream of electrons along a line extending through the opening and into the vacuum chamber;

a cathode outside the vacuum chamber and located out of visual contact with the commodity for generating electrons, the cathode communicating with the opening for supplying an electron stream to the opening;

an anode in the vacuum chamber for attracting the electron stream through the opening and to the commodity surface;

magnetic means associated with the vacuum chamber for generating a magnetic field in the vacuum chamber with flux extending substantially parallel to the line for influencing movement of the electron stream along the line and to the commodity surface, the magnetic means comprising at least two magnetic coils extending around the vacuum chamber and spaced from each other along the line; and means for temporally varying the magnetic field during a heating-up phase for the commodity so that the magnetic field varies in strength in the direction along the line and away from the opening for distributing the electron stream uniformly onto the commodity surface, the means for varying the magnetic field being connected to said two magnetic coils for actuating the magnetic coils to produce respective magnetic fields having different strengths from each other, and for alternately varying the strengths of the two magnetic fields for distributing electrons along the line and uniformly onto the commodity surface.

7. An apparatus according to claim 6, wherein the commodity surface extends substantially parallel to the line.

8. An apparatus according to claim 7, wherein the vacuum chamber has an axis extending along the line.

9. An apparatus according to claim 7, wherein said means for generating the magnetic field is mounted for movement with respect to the commodity for varying the magnetic field.

* * * * *